(12) United States Patent
Kanamoto

(10) Patent No.: US 6,728,943 B2
(45) Date of Patent: Apr. 27, 2004

(54) SEMICONDUCTOR CIRCUIT EXTRACTION APPARATUS AND METHOD

(75) Inventor: Toshiki Kanamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 310 days.

(21) Appl. No.: 09/848,209

(22) Filed: May 4, 2001

(65) Prior Publication Data

US 2002/0063569 A1 May 30, 2002

(30) Foreign Application Priority Data

Nov. 24, 2000 (JP) ........................ 2000-358356

(51) Int. Cl.⁷ .................... G06F 17/50; G06F 9/45
(52) U.S. Cl. .................. 716/12; 716/13; 716/14; 716/6
(58) Field of Search ................. 716/12–14, 6

(56) References Cited

U.S. PATENT DOCUMENTS

| | | | | |
|---|---|---|---|---|
| 5,223,733 A | * | 6/1993 | Doi et al. ............... | 257/386 |
| 5,446,674 A | * | 8/1995 | Ikeda et al. ............. | 716/5 |
| 5,987,086 A | * | 11/1999 | Raman et al. ........... | 716/1 |
| 6,006,024 A | * | 12/1999 | Guruswamy et al. ...... | 716/12 |
| 6,175,947 B1 | * | 1/2001 | Ponnapalli et al. ....... | 716/5 |
| 6,185,722 B1 | * | 2/2001 | Darden et al. ........... | 716/5 |
| 6,381,730 B1 | * | 4/2002 | Chang et al. ............ | 716/5 |
| 6,434,724 B1 | * | 8/2002 | Chang et al. ............ | 716/4 |
| 6,473,887 B1 | * | 10/2002 | Dewey, III et al. ....... | 716/5 |
| 6,477,686 B1 | * | 11/2002 | Dewey, III et al. ....... | 716/5 |
| 2002/0056070 A1 | * | 5/2002 | Tanaka .................... | 716/2 |

FOREIGN PATENT DOCUMENTS

JP  A-10-70192  3/1998

* cited by examiner

*Primary Examiner*—A. M. Thompson
(74) *Attorney, Agent, or Firm*—Burns, Doane, Swecker & Mathis, LLP

(57) ABSTRACT

A semiconductor circuit extraction apparatus: detects the uppermost wiring layer of a cell; carries out virtual wiring conductor routing on all tracks of a cell-top wiring layer directly overlying the uppermost wiring layer of the cell; extracts parasitic capacitances of all the wiring conductors including those virtually routed; and calculates the delay time of placement/routing data in accordance with the extracted parasitic capacitances to provide highly accurate delay information library data.

1 Claim, 4 Drawing Sheets

SEMICONDUCTOR CIRCUIT EXTRACTION APPARATUS AND METHOD

BACKGROUND OF THE INVENTION

1. Field of the Invention

The present invention relates to a semiconductor circuit extraction apparatus, an autoplacement/routing apparatus, their methods and a library distribution system for designing a semiconductor integrated circuit by combining a plurality of cells pre-registered in a cell library.

2. Description of the Prior Art

FIG. 4 is a diagram depicting the layout of a yet-to-be placed and routed discrete cell, and FIG. 5 is a diagram showing the layout of the cell after placement/routing by the conventional autoplacement/routing apparatus.

In FIGS. 4 and 5, reference numeral 101 denotes a semiconductor substrate; 102 denotes a diffused layer; 103 denotes poly-silicon wiring; 104 denotes first layer wiring formed of metal such as aluminum (Al); 105 denotes first contacts for connecting the diffused layer 102 and the first layer wiring 104; 106 denotes second contacts for connecting the poly wiring 103 and the first layer wiring 104; and 107 second layer wiring formed of metal such as aluminum. The first and second contacts are formed on first and second interlayer insulating films (not shown), respectively.

The operation of the above prior art example will be described below in brief.

In the first place, the parasitic capacitance between respective wiring conductors in the cell is extracted by a semiconductor circuit extraction apparatus to compute delays in the signal propagation from the input to output of the cell, and the delay information thus obtained is stored as library data for subsequent autoplacement/routing in a cell library. Then, the yet-to-be placed and routed discrete cell (FIG. 4) is prepared, on which the autoplacement/routing apparatus carries out required conductor placement/routing in accordance with the delay information stored in the cell library.

In this instance, the prior art computes the delay time based solely on the parasitic capacitance between the wiring conductors of the cell without regard to the influence of wiring conductors that might be routed across the cell surface afterward.

Accordingly, when the wiring conductors extending across the cell surface (which wiring will hereinafter be referred to as cell-top wiring conductors) are present after the conductor placement/routing, the actual delay time becomes longer than the delay time stored in the cell library due to parasitic capacitances between the cell-top wiring conductors and the wiring conductors in the cell (which wiring will hereinafter be referred to as intra-cell wiring conductors); that is, the prior art has a defect that the delay computation based on the prestored library data underestimates the delay time.

SUMMARY OF THE INVENTION

It is therefore an object of the present invention to provide a semiconductor circuit extraction apparatus, an autoplacement/routing apparatus, their methods and a library distribution system that permit accurate computation of the delay time as data for placement/routing in accordance with parasitic capacitances between the cell-top wiring conductors and the intra-cell wiring conductors.

The semiconductor circuit extraction apparatus according to an aspect of the present invention comprises: means for detecting the uppermost wiring layer of the cell; and means for virtually routing a wiring conductor on every wiring track of a cell-top wiring layer directly overlying the uppermost wiring layer of the cell and for extracting parasitic capacitances of the virtually routed wiring conductors as well as all the internal wiring conductors of the cell.

According to another aspect of the invention, the parasitic capacitance extracting means forms or generates a wiring conductor of the minimum line width defined by design rules on each of wiring tracks spaced apart a distance defined by the autoplacement/routing apparatus in the cell-top wiring layer directly overlying the uppermost wiring layer of the cell.

According to another aspect of the invention, the capacitance extracting means provides, as library data, delay information derived using the extracted parasitic capacitances.

The autoplacement/routing apparatus according to another aspect of the present invention comprises placement means, global routing means, detailed routing means and additional routing means. The placement means, the global routing means and the detailed routing means are driven in this order. Subsequent to detailed routing by the detailed routing means, the additional routing means inputs information about the uppermost wiring layer of the cell and performs additional wiring conductor routing on blank tracks in a virtual cell-top wiring layer.

According to another aspect of the invention, the autoplacement/routing apparatus obtains the information about the uppermost wiring layer of the cell from the uppermost wiring layer detecting means of the semiconductor circuit extraction apparatus.

According to another aspect of the invention, the additional routing means retrieves wiring tracks in the cell-top wiring layer directly overlying the uppermost wiring layer based on the information about the uppermost wiring layer, then stores wiring grids with no wiring element, and forms or generates wiring conductors connecting the stored wiring grids.

The autoplacement/routing method according to another aspect of the present invention comprises the steps of: registering in a cell library, as cell data, information indicating the virtually routed cell-top wiring layer directly overlying the uppermost wiring layer of the cell, together with delay information derived using extracted parasitic capacitances of all the wiring conductors including those virtually routed wiring conductors of the cell-top wiring layer; offering the cell library with the registered data; and reading out the registered information from the cell library and inputting it to the autoplacement/routing apparatus.

According to another aspect of the invention, the autoplacement/routing apparatus further comprises an additional routing step of routing additional wiring conductors on blank tracks in the virtually routed cell-top wiring layer directly overlying the uppermost wiring layer of the cell after detailed routing.

The semiconductor circuit extraction method according to another aspect of the invention comprises the steps of: virtually routing wiring conductors on all tracks of the cell-top wiring layer directly overlying the uppermost wiring layer of the cell; and extracting the parasitic capacitances of all the wiring conductors including those virtually routed conductors of the cell-top wiring layer.

The library distribution system according to another aspect of the present invention comprises: means for registering in a cell library, as cell data, information indicating the virtually routed cell-top wiring layer directly overlying the uppermost wiring layer of the cell, together with delay information derived using extracted parasitic capacitances of all the wiring conductors including those virtually routed wiring conductors of the cell-top wiring layer; means for offering the cell library with the registered data to a customer; and means for reading out the registered information from the cell library and for inputting it to the autoplacement/routing apparatus on the part of the customer.

According to still another aspect of the present invention, the library distribution system further comprises additional routing means for routing additional wiring conductors on blank tracks in the virtually routed cell-top wiring layer directly overlying the uppermost wiring layer of the cell after detailed routing.

DETAILED DESCRIPTION OF THE PREFERRED EMBODIMENTS

First Embodiment

Figure 1A:
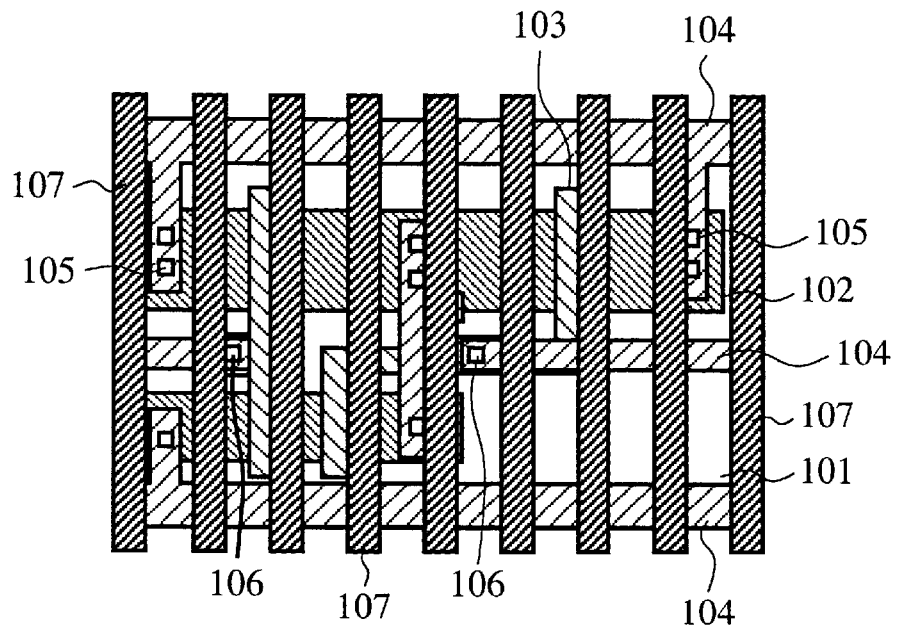
FIG. 1(a) is a diagram illustrating a wiring layout by a semiconductor circuit extraction apparatus and an autoplacement/routing apparatus according to a first embodiment of the present invention.
Figure 1B:
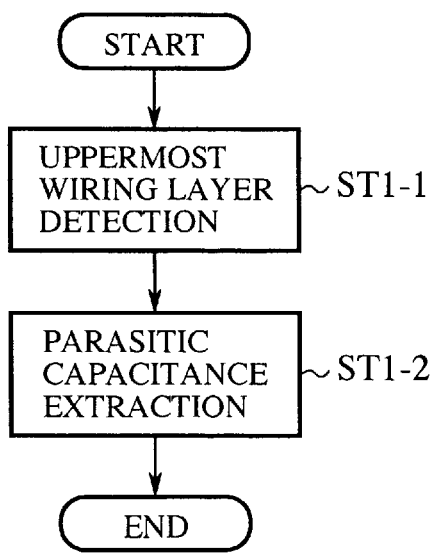
FIG. 1(b) is a flowchart showing the parasitic capacitance extraction by the semiconductor circuit extraction apparatus.

FIG. 1(a) illustrates a wiring layout by the semiconductor circuit extraction apparatus and the autoplacement/routing apparatus according to a first embodiment (Embodiment 1), and FIG. 1(b) is a flowchart depicting the procedure of extracting the parasitic capacitance by the semiconductor circuit extraction apparatus.

Reference numeral 101 denotes a semiconductor substrate; 102 denotes a diffused layer; 103 denotes poly-silicon wiring; 104 denotes first layer wiring formed of metal such as aluminum (Al); 105 denotes first contacts for connecting the diffused layer 102 and the first layer wiring 104; 106 denotes second contacts for connecting the poly-silicon wiring 103 and the first layer wiring; and 107 second layer wiring formed of metal such as aluminum. The first and second contacts are formed on first and second interlayer insulating films (not shown), respectively.

The cell has a construction in which the diffused layer 102 and the poly-silicon wiring 103 are connected to the first layer wiring 104 via the first and second contacts 105 and 106, respectively. The diffused layer 102, the poly-silicon wiring 103, the first contacts 105, the second contacts 106, the first layer wiring 104 and the second layer wiring 107 are formed in this order on the semiconductor substrate 101.

The semiconductor circuit extraction method according to this embodiment comprises the steps of: detecting the uppermost layer wiring to be used in the cell; and virtually routing wiring conductors on all (wiring) tracks of a wiring layer immediately overlying the uppermost one (ST1-1) and extracting parasitic capacitances of all the wiring conductors including those virtually routed (ST1-2). Delay information calculated based on the extracted parasitic capacitances is used as library data.

The operation of this embodiment will be described below.

In step ST1-1 of detecting the uppermost layer wiring layer of the cell, the semiconductor circuit extraction apparatus stores the vertical positional relationship of the wiring layers, then checks every wiring layer for the presence of at least one wiring element in the cell, and if present, stores the wiring layer as effective in the cell. And the semiconductor circuit extraction apparatus checks the wiring layers one by one from top to bottom and sets, as the uppermost wiring layer, the wiring layer stored first as effective.

In step ST1-2 of virtually routing wiring conductors and extracting parasitic capacitances of all wiring conductors including those virtually routed, the semiconductor circuit extraction apparatus routes wiring conductors, each having the minimum width defined by design rules, on wiring tracks in the cell-top wiring layer immediately overlying the uppermost wiring layer detected in step ST1-1, the wiring tracks being provided at the pitch defined by the autoplacement/routing apparatus.

Next, the parasitic capacitance between the wiring conductors inherently present in the cell and the capacitances between those wiring conductors and the newly provided wiring conductors are added to a net list of extraction results, as the capacitance between the wiring conductors in the cell and the substrate.

Then a circuit simulation is done using the net list obtained by steps ST1-1 and ST1-2 to detect delay in the signal propagation from the input to output of the cell.

Since the uppermost wiring layer in the cell is thus covered with the immediately overlying wiring layer at the time of placement and routing, the capacitive component between the immediately overlying wiring layer and the internal wiring of the cell is mostly shielded by the above-said overlying wiring layer. This reduces the error between the extracted capacitance and the capacitance at the time of actual placement and routing, hence permitting the calculation of the delay time based on the wiring capacitance far closer to that in the actual placement and routing than in the prior art.

As described above, according to Embodiment 1, the semiconductor circuit extraction circuit detects the uppermost layer wiring used in the cell, then virtually routes wiring conductors on all the wiring tracks in the cell-top wiring layer immediately overlying the uppermost layer wiring, then extracts the parasitic capacitances of all the wiring conductors including those virtually routed, and sets, as the library data, the delay information obtained using the extracted parasitic capacitances. This scheme reduces errors, which are attributable to the parasitic capacitance of the cell-top wiring layer, between the input-to-output propagation delay time stored in the cell library and the delay time after placement/routing, providing for increased accuracy in computing the delay time that is placement/routing data.

Second Embodiment

Figure 2A:
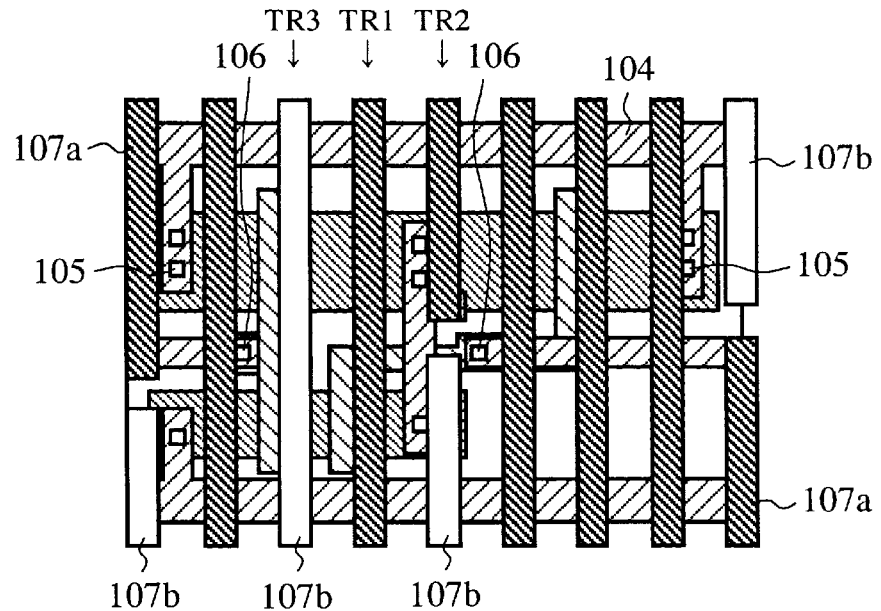
FIG. 2(a) is a diagram illustrating the layout of a wiring pattern formed by a semiconductor circuit extraction apparatus and an autoplacement/routing apparatus according to a second embodiment of the present invention.
Figure 2B:
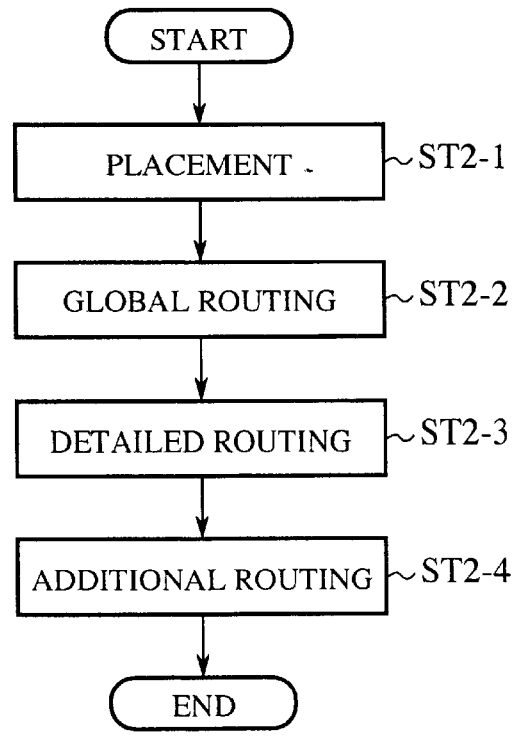
FIG. 2(b) is a flowchart showing the placement/routing by the autoplacement/routing apparatus.

FIG. 2(a) is a diagram depicting the wiring layout of a cell by a semiconductor circuit extraction apparatus and an autoplacement/routing apparatus according to a second embodiment (embodiment 2) of the present invention, and FIG. 2(b) is a flowchart showing the placement/routing by the autoplacement/routing apparatus. Incidentally, FIG. 2(b) shows the state in which additional wiring conductors are routed on blank tracks where no wiring conductors are present.

In FIG. 2, reference numeral 107a denotes a second layer wiring as of aluminum (Al), and 107b denotes additional wiring also formed of aluminum or the like. The constituent elements corresponding to those in the above are identified by the same reference numerals, and no description will be repeated for them.

In this embodiment, the second layer wiring 107a is used as the cell-top wiring layer as in Embodiment 1. In FIG. 2(a) there are shown a wiring track (TR1) actually occupied by a wiring conductor, a track (TR2) partly occupied by the cell-top wiring conductor and a track (TR3) with no wiring conductor after a detailed routing step (ST2-3) in FIG. 2(b).

Next, the operation of this embodiment will be described below.

In the autoplacement/routing, the detailed routing step (ST2-3) is followed by inputting information about the uppermost wiring detected previously in this embodiment. Next, each track of the cell-top wiring layer immediately overlying the uppermost wiring layer of each cell is checked and wiring grids with no wiring element are stored. And, wiring patterns connecting the stored grids are stored on the wiring tracks, after which wiring conductors connecting the stored grids are virtually formed on the wiring tracks in step ST2-4, which is referred to as "additional routing" in FIG. 2(b).

As a result, the cell-top wiring layer immediately overlying the uppermost wiring layer in the cell is formed only by wiring tracks occupied by wiring conductors. That is, it is assured that the cell-top wiring assumed in Embodiment 1 is present in the actual wiring layout after placement and routing.

Thus, the intra-cell delay stored in the cell library coincides with the delay in the cell with wiring conductors actually placed and routed therein—this makes it possible that the delay, which is a combination of the latter delay and the inter-cell delay, is calculated with high accuracy for each net after placement and routing.

As described above, according to Embodiment 2, since the autoplacement/routing apparatus is designed to carry out additional conductor routing on the blank tracks of the cell-top wiring layer after the detailed routing step, it can be assured that the virtual cell-top wiring is present in the actual wiring layout after the placement and routing of wiring conductors. And the intra-cell delay stored in the cell library coincides with the delay in the cell with wiring conductors actually placed and routed therein—this makes it possible that the delay, which is a combination of the latter delay and the inter-cell delay, is calculated with high accuracy for each net after placement and routing.

Third Embodiment

Figure 3:
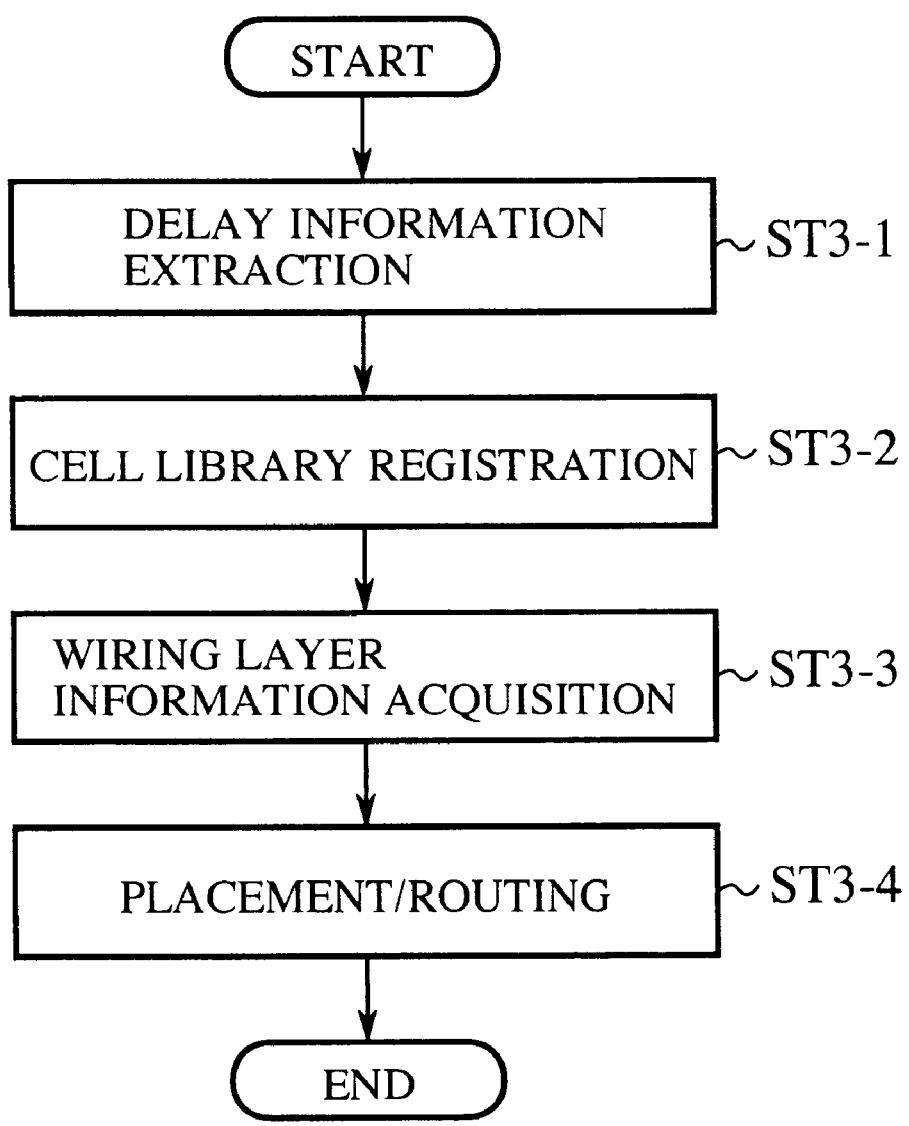
FIG. 3 is a flowchart showing the procedure of a library distribution system according to a third embodiment of the present invention.
Figure 4:
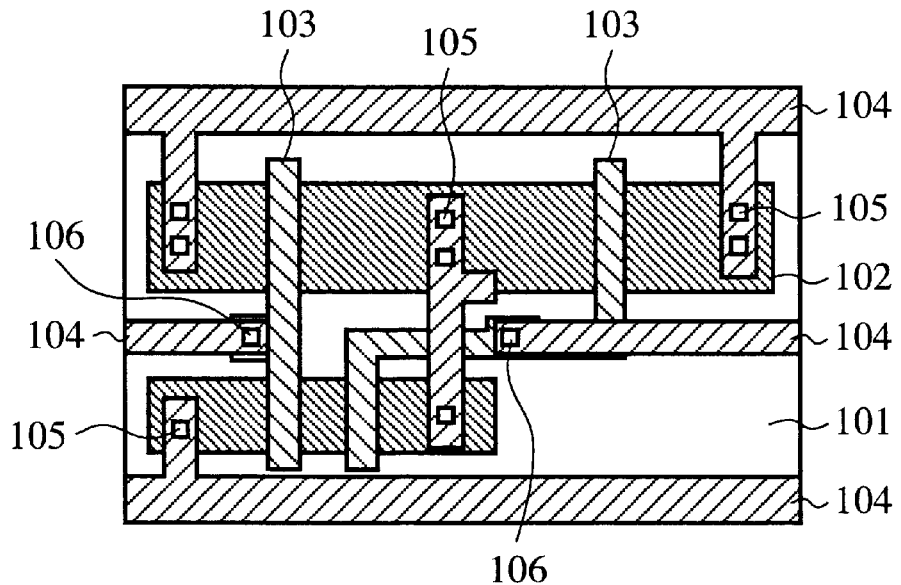
FIG. 4 is a diagram showing the layout of a yet-to-be placed/routed discrete cell.
Figure 5:
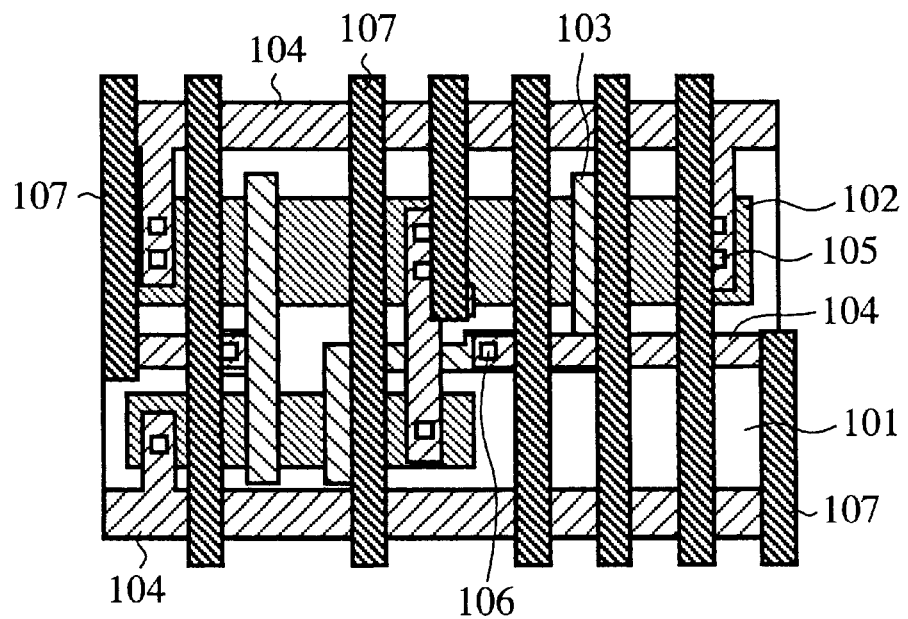
FIG. 5 is a diagram showing the layout of the discrete cell after placement/routing by a conventional autoplacement/routing apparatus.

FIG. 3 is a flowchart showing the procedure of a library distribution system according to a third embodiment (Embodiment 3) of the present invention.

According to this embodiment, in the case where a semiconductor IC manufacturer supplies a customer with cell library data so that the customer uses it to evaluate and improve wiring conductor placement/routing based on the signal propagation delay, the uppermost wiring layer information detected in Embodiment 1 is contained in the cell library with a view to achieving high accuracy in estimating the propagation delay.

Next, the operation of this embodiment will be described below.

In a cell delay information extracting step (ST3-1), information about the uppermost wiring layer of the cell is retrieved, and in a registration step (ST3-2) the retrieved information about the wiring layer concerned is registered in a cell library. Then in a wiring layer information acquisition step (ST3-3) the customer receives or purchases the cell library stored on a recording medium, and in a wiring conductor placement/routing step (ST3-4) wiring conductor placement/routing, including the additional routing characteristic of Embodiment 2, is carried out on the part of the customer.

Since the conventional cell library does not contain the uppermost wiring layer information, the intra-cell propagation delay is underestimated. By containing the information in the cell library and carrying out Embodiments 1 and 2, it is possible to provide such a high accuracy propagation delay estimating means as mentioned above.

As described above, according to Embodiment 3, the information about the virtually routed wiring layer is registered in the cell library together with delay information, then the cell library is supplied to a customer, and the customer reads out the registered wiring layer information from the cell library and inputs the read-out information to the autoplacement/routing apparatus of Embodiment 2 to carry out wiring conductor placement/routing. Accordingly, it is possible to supply a high accuracy delay estimating means for a semiconductor circuit.

Effect of the Invention

As will be appreciated from the above, according to the present invention, the semiconductor circuit extraction apparatus comprises: means for detecting the uppermost wiring layer of the cell; and means for virtually routing a wiring conductor on every wiring track of a cell-top wiring layer directly overlying the uppermost wiring layer of the cell and for extracting parasitic capacitances of the virtually routed wiring conductors as well as all the internal wiring conductors of the cell. By calculating the delay in propagation from the input to output of the cell based on the extracted parasitic capacitance and adding the calculated delay time to that stored in the cell library to correct it, an error attributable to the parasitic capacitance of the cell-top wiring is reduced between the corrected delay time and the delay time after conductor placement/routing—this enhances the accuracy of calculating the delay time that is placement/routing data.

According to the present invention, the parasitic capacitance extracting means virtually forms or generates a wiring conductor of the minimum line width defined by design rules on each of wiring tracks spaced apart a distance defined by the autoplacement/routing apparatus in the cell-top wiring layer directly overlying the uppermost wiring layer of the cell. Accordingly, it is possible to calculate the delay time based on the wiring capacitance closer to that of the actual wiring, providing increased accuracy in calculating the delay time that is placement/routing data.

According to the present invention, the capacitance extracting means provides, as library data, delay information derived using the extracted parasitic capacitances. By registering the data in the cell library, it is possible for a user to obtain the wiring layer information and calculate the delay time with high accuracy.

According to the present invention, since the autoplacement/routing apparatus includes additional routing means which, after the detailed routing is carried out by the detailed routing means, inputs information about the uppermost wiring layer of the cell and carries out additional wiring conductor routing on blank tracks in the virtual cell-top wiring layer, the cell-top wiring layer directly overlying the uppermost wiring layer of the cell can be formed by tracks occupied by wiring conductors. This assures that the virtual cell-top wiring layer is present in the actual wiring layout of the cell with wiring conductors placed and routed therein. Hence, the intra-cell delay stored in the cell library coincides with the delay in the cell with wiring conductors actually placed and routed therein, providing for increased accuracy in calculating the delay for each net after the placement/routing operation.

According to the present invention, since the autoplacement/routing apparatus is adapted to obtain the information about the uppermost wiring layer of the cell from the uppermost wiring layer detecting means of the semiconductor circuit extraction apparatus, the use of this information as library data for the autoplacement/routing apparatus enables the delay time to be calculated with high accuracy, taking into account the parasitic capacitance between the cell-top wiring layer and the intra-cell wiring conductors.

According to the present invention, since the additional routing means retrieves wiring tracks in the cell-top wiring layer directly overlying the uppermost wiring layer based on the information about the uppermost wiring layer of the cell, then stores wiring grids with no wiring element, and virtually forms or generates wiring conductors connecting the stored wiring grids, the cell-top wiring layer can be formed by wiring tracks occupied by wiring conductors.

According to the present invention, the autoplacement/routing method comprises the steps of: registering in a cell library, as cell data, information indicating the virtually routed cell-top wiring layer immediately overlying the uppermost wiring layer of the cell, together with delay information derived using extracted parasitic capacitances of all the wiring conductors including those virtually routed wiring conductors of the cell-top wiring layer; supplying the cell library with the registered data to a customer; and reading out the registered information from the cell library and inputting it to the autoplacement/routing apparatus on the part of the customer. This scheme overcomes the defect of underestimation of the delay time experienced in the prior art and permits high accuracy delay estimation.

According to the present invention, the autoplacement/routing method includes an additional routing step of routing additional wiring conductors on blank tracks in the virtually routed cell-top wiring layer directly overlying the uppermost wiring layer of the cell after detailed routing. This also permits high accuracy estimation of the delay.

According to the present invention, the semiconductor circuit extraction method is adapted to: virtually carrying out wiring conductor routing on all tracks of the cell-top wiring layer directly overlying the uppermost wiring layer of the cell; and extract the parasitic capacitances of all the wiring conductors including those virtually routed conductors of the cell-top wiring layer. By calculating the delay in propagation from the input to output of the cell based on the extracted parasitic capacitance and adding the calculated delay time to that stored in the cell library to correct it, an error attributable to the parasitic capacitance of the cell-top wiring is reduced between the corrected delay time and the delay time after conductor placement/routing—this enhances the accuracy of calculating the delay time that is placement/routing data.

According to the present invention, the library distribution system comprises: means for registering in a cell library, as cell data, information indicating the virtually routed cell-top wiring layer immediately overlying the uppermost wiring layer of the cell, together with delay information derived using extracted parasitic capacitances of all the wiring conductors including those virtually routed wiring conductors of the cell-top wiring layer; means for supplying the cell library with the registered data to a customer; and means for reading out the registered information from the cell library and inputting it to the autoplacement/routing apparatus on the part of the customer. This system overcomes the defect of underestimation of the delay time experienced in the prior art and permits high accuracy delay estimation.

According to the present invention, the library distribution system includes additional routing means for routing additional wiring conductors on blank tracks in the virtually routed cell-top wiring layer directly overlying the uppermost wiring layer of the cell after detailed routing. This also permits high accuracy estimation of the delay.

What is claimed is:

1. A semiconductor circuit extraction apparatus comprising:

means for detecting an uppermost wiring layer of a cell, the cell comprising wiring conductors; and means for virtually routing wiring conductors on every wiring track of a cell-top wiring layer directly overlying the uppermost wiring layer of the cell and for extracting parasitic capacitances of the virtually routed wiring conductors and internal wiring conductors of the cell, wherein the parasitic capacitance extracting means provides, as library data, delay information derived using the extracted parasitic capacitances.

* * * * *